(12) United States Patent
Bleeker et al.

(10) Patent No.: US 7,894,037 B2
(45) Date of Patent: Feb. 22, 2011

(54) LITHOGRAPHIC APPARATUS AND DEVICE MANUFACTURING METHOD

(75) Inventors: Arno Jan Bleeker, Westerhoven (NL); Aschwin Lodewijk Hendricus Johannes Van Meer, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 823 days.

(21) Appl. No.: 11/882,081

(22) Filed: Jul. 30, 2007

(65) Prior Publication Data
US 2009/0033889 A1     Feb. 5, 2009

(51) Int. Cl.
*G03B 27/52* (2006.01)

(52) U.S. Cl. .............................. 355/30; 355/53; 355/72; 356/237.4; 427/534

(58) Field of Classification Search .................... 355/30, 355/53, 72; 356/237.4; 427/534
See application file for complete search history.

(56) References Cited

U.S. PATENT DOCUMENTS

| | | | | |
|---|---|---|---|---|
| 5,746,928 A | * | 5/1998 | Yen et al. | 216/37 |
| 5,825,470 A | * | 10/1998 | Miyai et al. | 355/72 |
| 5,893,962 A | * | 4/1999 | Mizuno et al. | 118/723 E |
| 6,143,128 A | * | 11/2000 | Ameen et al. | 156/345.24 |
| 6,392,738 B1 | | 5/2002 | Van de Pasch et al. | 355/30 |
| 2002/0153024 A1 | * | 10/2002 | Akiba | 134/1.1 |
| 2004/0105084 A1 | | 6/2004 | Kurt et al. | |
| 2004/0165160 A1 | | 8/2004 | Van Beek et al. | 355/30 |
| 2006/0221314 A1 | * | 10/2006 | Wilhelmus Jacobs et al. | 355/30 |
| 2007/0146658 A1 | | 6/2007 | Van Mierlo et al. | |
| 2007/0146660 A1 | * | 6/2007 | Lorenz Van Der Velden et al. | 355/30 |

FOREIGN PATENT DOCUMENTS

| | | |
|---|---|---|
| EP | 1329773 A2 | 7/2003 |
| EP | 1429189 A1 | 6/2004 |
| JP | 08115868 | 5/1996 |
| WO | 2008007952 A2 | 1/2008 |

OTHER PUBLICATIONS

International Preliminary Report on Patentability, issued by the International Bureau of WIPO on Feb. 11, 2010 in related International Patent Application No. PCT/EP2008/006145.

* cited by examiner

*Primary Examiner*—Hung Henry Nguyen
*Assistant Examiner*—Steven H Whitesell-Gordon
(74) *Attorney, Agent, or Firm*—Pillsbury Winthrop Shaw Pittman LLP

(57) ABSTRACT

A lithographic apparatus includes an illumination system configured to condition a beam of radiation; a pattern support configured to hold a patterning device, the patterning device configured to pattern the beam of radiation to form a patterned beam of radiation; a substrate holder configured to hold a substrate, the substrate holder including a support surface in contact with the substrate; a projection system configured to project the patterned beam of radiation onto the substrate; and a cleaning system including a cleaning unit, the cleaning unit constructed and arranged to generate radicals on the support surface of the substrate holder to remove contamination therefrom.

21 Claims, 7 Drawing Sheets

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Photolithography is widely recognized as one of the key steps in the manufacture of ICs and other devices and/or structures. At present, no alternative technology seems to provide the desired pattern architecture with similar accuracy, speed, and economic productivity. However, as the dimensions of features made using photolithography become smaller, photolithography is becoming one of the most, if not the most, critical gating factors for enabling miniature IC or other devices and/or structures to be manufactured on a truly massive scale.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature.

It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to significantly shorten the exposure wavelength and, thus, reduce the minimum printable pitch, it has been proposed to use an extreme ultraviolet (EUV) radiation source. In contrast to conventional ultraviolet radiation sources, which are configured to output a radiation wavelength greater than about 193 nm, EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

It is desirable to improve the throughput of EUV lithographic apparatus to reduce the cost of ownership of the apparatus. Many factors may influence the throughput of the EUV system.

SUMMARY

It is desirable to remove contamination in the EUV lithographic apparatus. Removal of contamination improves the availability of the apparatus.

In an aspect of the invention, there is provided a lithographic apparatus including an illumination system configured to condition a beam of radiation; a pattern support configured to hold a patterning device, the patterning device configured to pattern the beam of radiation to form a patterned beam of radiation; a substrate holder configured to hold a substrate, the substrate holder including a support surface in contact with the substrate; a projection system configured to project the patterned beam of radiation onto the substrate; and a cleaning system including a cleaning unit, the cleaning unit constructed and arranged to generate radicals on the support surface of the substrate holder to remove contamination therefrom.

In an aspect of the invention, there is provided a device manufacturing method including conditioning a beam of radiation; patterning the beam of radiation to form a patterned beam of radiation; projecting the patterned beam of radiation onto a substrate, the substrate supported by a support surface of a substrate holder; and generating radicals on the support surface of the substrate holder to remove contamination therefrom.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
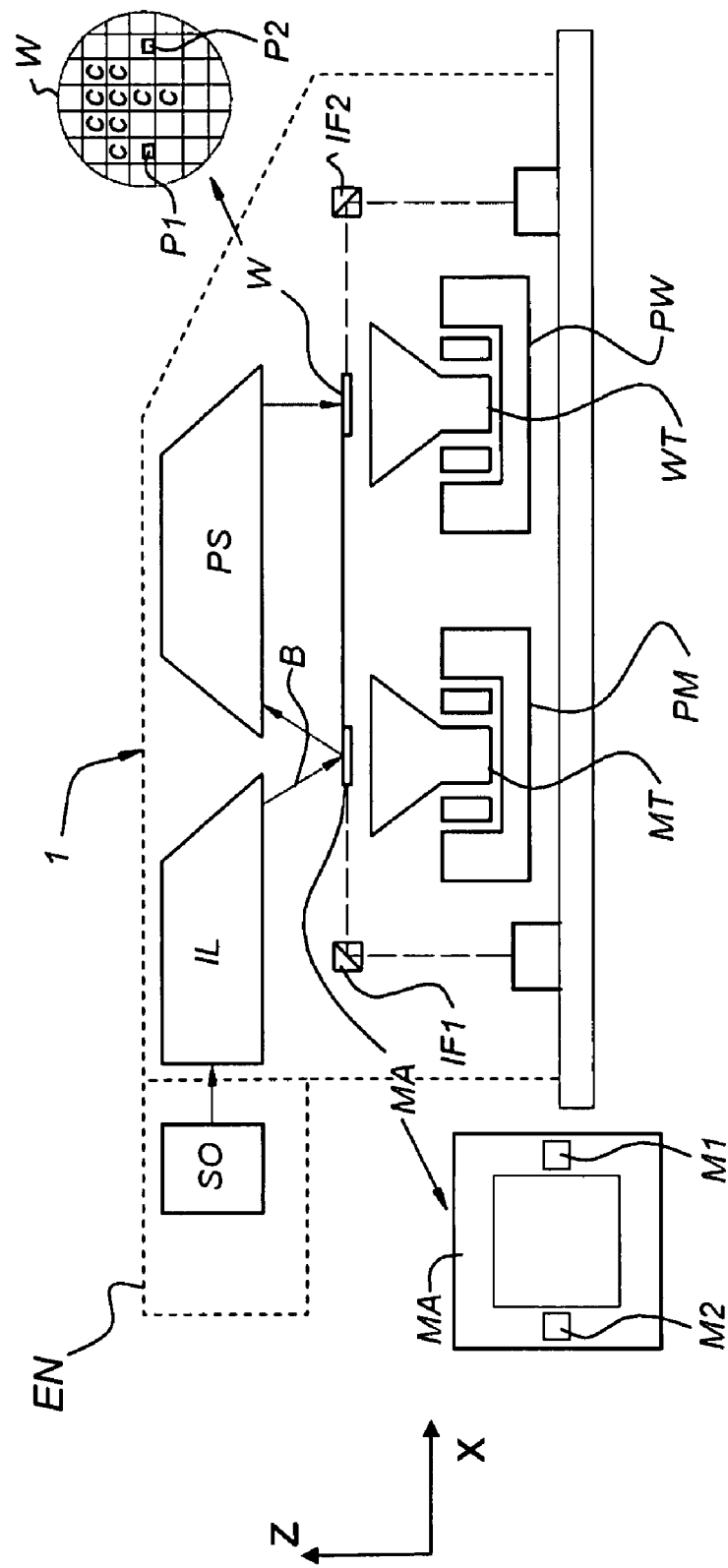
FIG. 1 schematically depicts a lithographic apparatus in accordance with an embodiment of the invention.

FIG. 1 schematically depicts a lithographic apparatus 1 according to an embodiment of the present invention. The apparatus 1 includes a source SO configured to generate radiation, an illumination system (illuminator) IL configured to condition a radiation beam B (e.g. EUV radiation) from the radiation received from source SO. The source SO may be provided as a separate unit. A support or pattern support (e.g. a mask table) MT is configured to support a patterning device (e.g. a mask) MA and is connected to a first positioning device PM configured to accurately position the patterning device MA in accordance with certain parameters. A substrate table or substrate support (e.g. a wafer table) WT is configured to hold a substrate (e.g. a resist-coated wafer) W and is connected to a second positioning device PW configured to accurately position the substrate W in accordance with certain parameters. A projection system (e.g. a refractive projection lens system) PS is configured to project a pattern imparted to the radiation beam B by patterning device MA onto a target portion C (e.g. including one or more dies) of the substrate W.

The lithographic apparatus 1 also includes a vacuum wall EN to enclose various elements of the apparatus. The vacuum wall EN may enclose various chambers (not shown in FIG. 1) that include, e.g., the illumination system IL, the projection system PS and other elements of the apparatus 1. If the source SO is part of the lithographic apparatus 1, the vacuum wall EN may also enclose a chamber that includes the source SO. These chambers may be filled with a gas that is selected to prevent absorption of the radiation beam outputted by the source SO and to prevent contamination of various optical elements. The gas may be selected based on the configuration of the apparatus 1. For example, in one implementation, the lithographic apparatus 1 is an extreme ultraviolet (EUV) lithographic system and the various chambers of the vacuum wall EN may be pumped down to vacuum and have a small background pressure of molecular hydrogen ($H_2$). In another implementation, the various chambers of the vacuum wall may have a background pressure of Nitrogen. It will be appreciated that additional gases may also be used in other embodiments of the invention.

The illumination system may include various types of optical components, such as refractive, reflective, magnetic, electromagnetic, electrostatic or other types of optical components, or any combination thereof, to direct, shape, or control radiation.

The support or pattern support holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus 1 is of a reflective type (e.g. employing a reflective mask). Alternatively, the apparatus may be of a transmissive type (e.g. employing a transmissive mask).

The lithographic apparatus 1 may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus 1 may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser (not shown in FIG. 1). The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. After being reflected by the patterning device MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the patterning device MA with respect to the path of the radiation beam B, e.g. after mechanical retrieval from a mask library, or during a scan. In general, movement of the support MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks may be located between the dies.

The depicted apparatus could be used in at least one of the following modes:

In step mode, the support MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support MT and the substrate table WT are scanned synchronously while a pattern imparted to the radiation beam is projected onto a target portion C (i.e. a single dynamic exposure). The velocity and direction of the substrate table WT relative to the support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
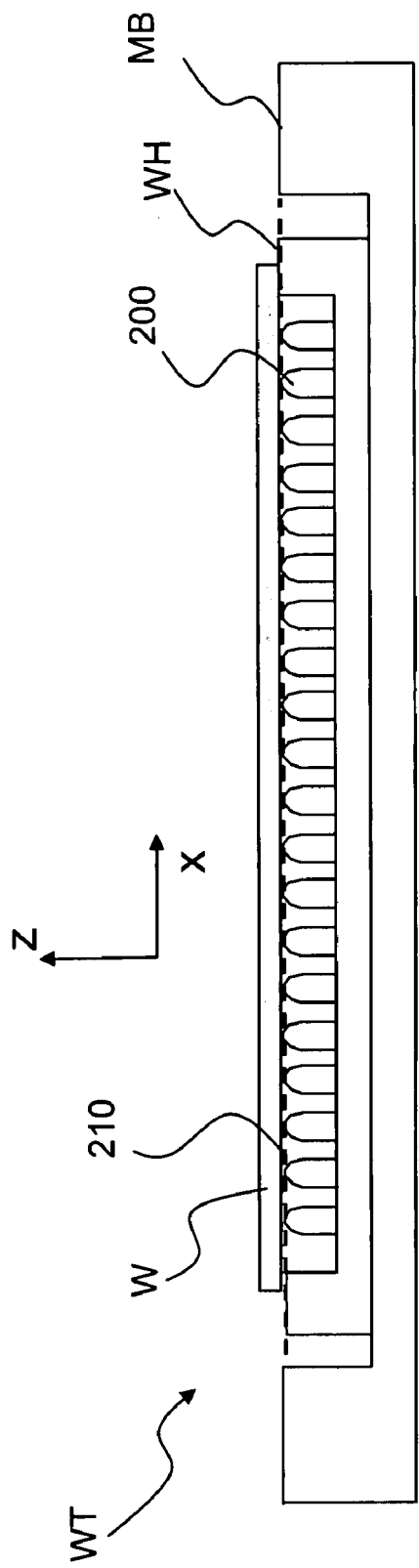
FIGS. 2a-b schematically show a substrate table in accordance with an embodiment of the invention.

FIG. 2a schematically shows a cross section of the substrate table WT of FIG. 1 in accordance with an embodiment of the invention. Substrate table WT includes a main block, also referred to hereinafter as a mirror block, MB and a substrate holder WH. The substrate holder WH is positioned on the main block or mirror block MB and includes a plurality of protrusions 200 that support the substrate W. The mirror block MB may include one or more mirrors and/or gratings disposed on one or more side(s) thereof. The one or more mirrors and/or gratings are configured to cooperate with an interferometer and/or an encoder system to control the position of the substrate holder WH. A roughness (e.g. nanoroughness) is provided on top of the protrusions 200 to prevent the substrate W from being stuck on the substrate holder WH. The top of the protrusions 200 that contact the substrate W collectively define a supporting surface 210, which is schematically depicted by a dashed line in FIG. 2a. When the substrate W is loaded onto the support surface 210 of the substrate table WT, the substrate W may be sucked against the support surface 210, e.g. by applying a vacuum to the space defined in between the protrusions 200. Alternatively, the substrate W may be clamped onto the substrate holder WH using, e.g., an electrostatic force. Using these methods, the substrate W takes a form determined by the support surface 210. Specifically, the form of the substrate W is determined by the contact surfaces of the protrusions 200 that are all located in the same plane.

Figure 2B:
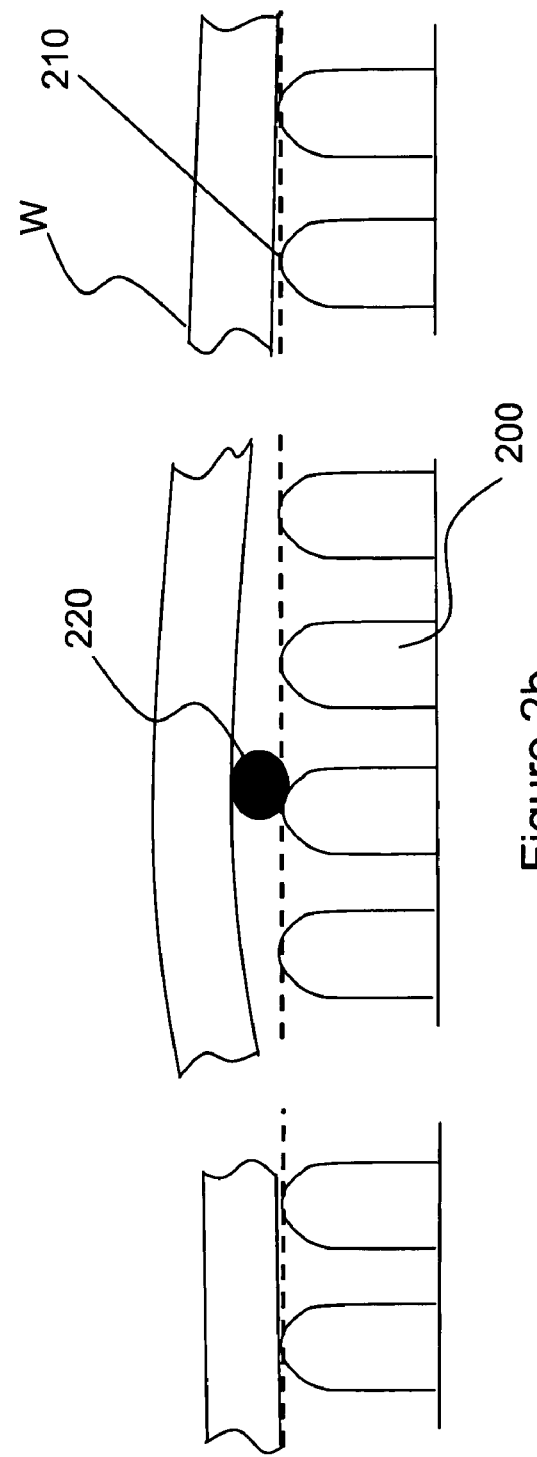

Referring now to FIG. 2b, if one or more contamination particle(s) 220 is/are present in between the support surface 210 and the backside surface of the substrate W, the form of the substrate W is not only determined by the form of the support surface 210 but also by the contamination particle(s) 220. FIG. 2b shows a cross section of the substrate holder at various locations along the x direction. As shown in FIG. 2b, the contamination particle 220 may cause an unacceptable deformation of the substrate, which may result in focus and overlay errors during imaging of the pattern in the patterning device onto a top surface of the substrate. These errors may result in a rejection of manufactured substrates and, thus, in a lower throughput of the lithographic apparatus 1. This may increase the overall operating costs of the lithographic apparatus 1.

Figure 3:
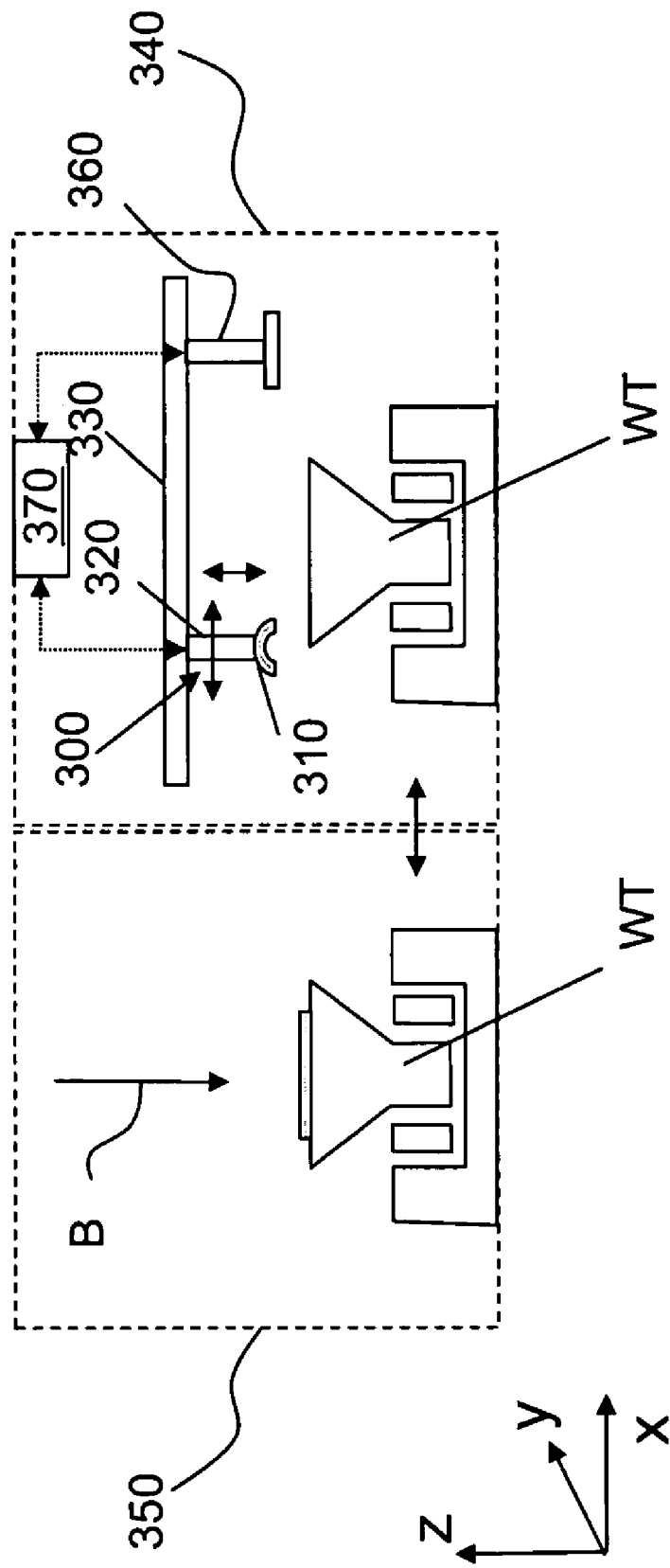
FIG. 3 schematically shows an exposure area and a metrology area of the apparatus of FIG. 1 in accordance with an embodiment of the invention.

In order to reduce contamination particles that may be present on the substrate table WT, the lithographic apparatus 1 may include a cleaning system configured to remove the contamination particles. FIG. 3 shows a schematic representation of the cleaning system 300 in accordance with an embodiment of the invention. The cleaning system 300 includes a cleaning unit 310 configured to clean the substrate table WT. The cleaning system 300 is an in situ system that may be positioned in the metrology area of the lithographic apparatus 1. The cleaning unit 310 may be used to clean the substrate table WT in between unloading of a substrate from and loading of another substrate W onto the substrate table WT.

As shown in FIG. 3, the cleaning unit 310 is mounted to a frame 330 and positioned in the metrology area 340 of the lithographic apparatus 1. In an embodiment, the frame 330 is a metrology frame that is configured to support metrology elements (e.g., interferometer and/or encoder systems). The metrology area 340 is an area within the lithographic apparatus 1 where multiple measurements (e.g. substrate alignment, exposed pattern characterizations, . . . ) may be made on the substrate W. In practice, the substrate table WT is movable from the exposure area 350 to the metrology area 340 and vice versa. The lithographic apparatus 1 may also include more than one substrate table WT that may be used in parallel. For example, measurements or cleaning may be carried out on a first substrate table while one or more other tables are being used for exposure.

The cleaning system 300 also includes a driving unit 320 that is configured to move or drive the cleaning unit 310 with respect to the frame 330. The driving unit 320 may be constructed and arranged to move the cleaning unit 310 along the vertical z direction (i.e. the direction substantially perpendicular to the upper surface of the substrate table) and/or the horizontal x direction. In this configuration, during the cleaning procedure, the cleaning unit 310 is lowered to a position proximate the support surface 210 of the substrate holder WH and the substrate table WT is then moved with respect to the cleaning unit 310 to ensure that the entire support surface is cleaned. Contamination that may be present on one or more of the protrusions 200 will be substantially removed by the cleaning unit 310. Alternatively, in another embodiment of the invention, the substrate table WT may be fixed during the cleaning procedure and the cleaning unit 310 may be moved over the entire surface (i.e. in the x and y directions) of the substrate table WT. The cleaning operation may be automated and is performed without opening the lithographic apparatus 1, which may considerably lower the down time and considerably increase the throughput of the apparatus 1.

Figure 4:
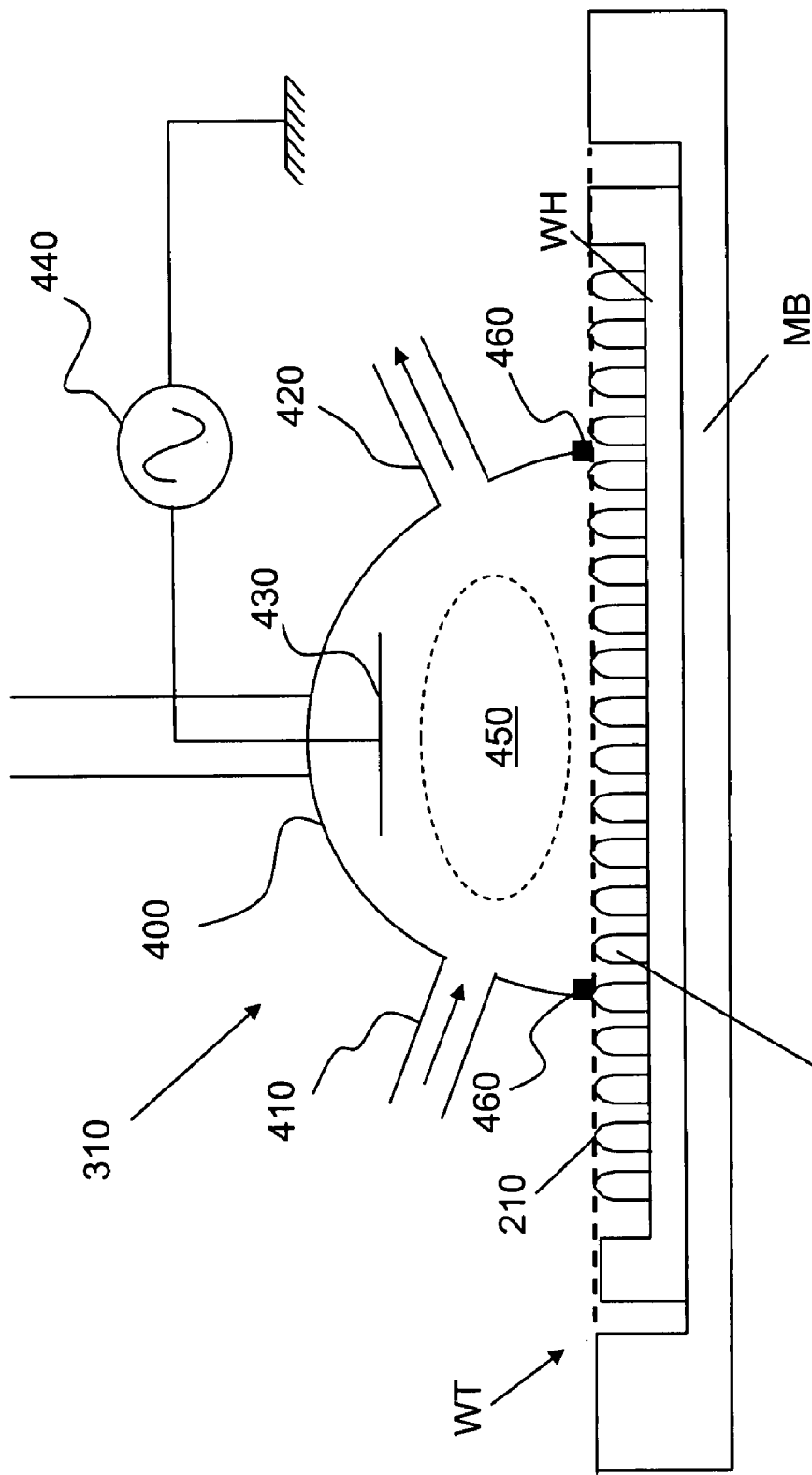
FIG. 4 schematically shows a cleaning unit in accordance with an embodiment of the invention.

Referring now to FIG. 4, this figure shows a schematic description of the cleaning unit 310 in accordance with an embodiment of the invention. The cleaning unit 310 is configured to produce a plasma that includes neutral radicals (e.g. hydrogen) that selectively etch away organic contaminants from the upper or support surface 210 of the substrate holder WH. Generally, organic contamination represents about 90 to 95% of the total contamination of the substrate holder WH. This organic contamination usually results from photoresist particles left during the coating process. The plasma cleaning in accordance with the embodiment of FIG. 4 may greatly reduce the overall contamination of the substrate holder WH to an acceptable level.

The cleaning unit 310 includes a housing or hood 400 having a first inlet 410 connected to a gas supply (not shown in FIG. 4) and an outlet 420 connected to a vacuum unit (not shown in FIG. 4). The gas supply and the vacuum unit may be part of the lithographic apparatus 1 or arranged outside the apparatus. The cleaning unit 310 also includes an RF electrode 430 or plasma generator arranged in the housing of hood 400 and connected to a RF power supply 440. In operation, a flow of gas, e.g. molecular hydrogen, is supplied to the housing or hood 400 and a plasma 450 is generated within the housing by the RF electrode 430. Hydrogen radicals, H., that are highly reactive are produced by the plasma 450. These neutral radicals react with the contaminants, e.g. organic contaminants, that may be present on the surface 210 of the substrate holder WH. These contaminants then desorb from the surface 210 and are subsequently extracted by the vacuum unit.

Removal of organic contaminants may also be achieved with the charged particles contained in the plasma. These charged particles are accelerated by the electric field between the electrode and the substrate holder WH so as to impinge on the surface 210.

In practice, the housing or hood 400 is located proximate the surface 210 of the substrate holder WH. A seal 460 may or may not be provided between the housing or hood 400 depending on the configuration of the lithographic apparatus 1. For example, if the lithographic apparatus 1 is an EUV lithographic apparatus, an atmosphere of hydrogen may be maintained in the space enclosed by the vacuum wall EN (or at least in some of the chambers enclosed by the vacuum wall EN) and outside the cleaning unit 310. In this configuration, no seal is needed between the housing or hood 400 and the surface 210 of the substrate holder WH. However, if it is desirable to maintain a vacuum or an atmosphere of a gas that is different from the gas used to generate the plasma, a seal 460 may be provided between the housing or hood 400 and the surface 210 of the substrate holder WH.

In the embodiment of FIG. 4, the use of radicals, e.g. hydrogen radicals, as opposed to a cleaning stone, may greatly reduce the likelihood of damage to the protrusions 200 since the mechanical erosion of the protrusions is limited. In general, it is desirable that the cleaning process limit as much as possible erosion of the protrusions 200 in order to maintain a sufficient roughness between the substrate W and the substrate holder WH. If the roughness is reduced, the substrate W may be stuck to the substrate holder WH and a stronger force may be needed to remove the substrate W from the substrate holder WH. This stronger force may potentially fracture and/or break the substrate W.

It will be appreciated that additional gas, e.g. oxygen, may be used in another embodiment of the invention. The gas is selected for its aptitude to produce radicals that react with the contamination particles that may be present on the substrate holder WH. It will also be appreciated that more than one inlet and/or outlet may be used in another embodiment of the invention. For example, in an embodiment, a plurality of outlets and inlets may be arranged at the periphery of the housing or hood 400. The location, shape and size of the inlet(s) and oulet(s) may also vary in other embodiments of the invention depending on the plasma to be formed. In addition, it is also possible to introduce the gas into the interior of the housing or hood 400 through the electrode 430. In this configuration, the electrode acts as a shower head.

Furthermore, while the cleaning unit 310 includes a plasma generator having an RF electrode and an RF source in the embodiment of FIG. 4, it will be appreciated that the plasma 450 may be produced differently in the cleaning unit 310. For example, a DC voltage may be used to create a gas discharge and the plasma 450. In another embodiment, an RF coil may be used to create the plasma 450. The RF coil may be positioned inside the housing or hood 400 around the area where the plasma 450 is formed.

In the embodiment of FIG. 4, the cleaning unit 310 is configured to produce a plasma on a localized area of the substrate holder WH. In this embodiment, the substrate table WT and the cleaning unit 310 may be moved relative to each other (e.g., the substrate table WT, the cleaning unit 310, or both is/are moved) to ensure that substantially the entire area of the substrate holder WH is exposed to the plasma 450. However, it is also possible that the cleaning unit 310 be dimensioned to create a plasma 450 over, substantially, the entire area of the substrate holder WH. In this alternative embodiment, the housing or hood 400 may be sized to substantially cover the entire surface of the substrate holder WH.

Figure 5:
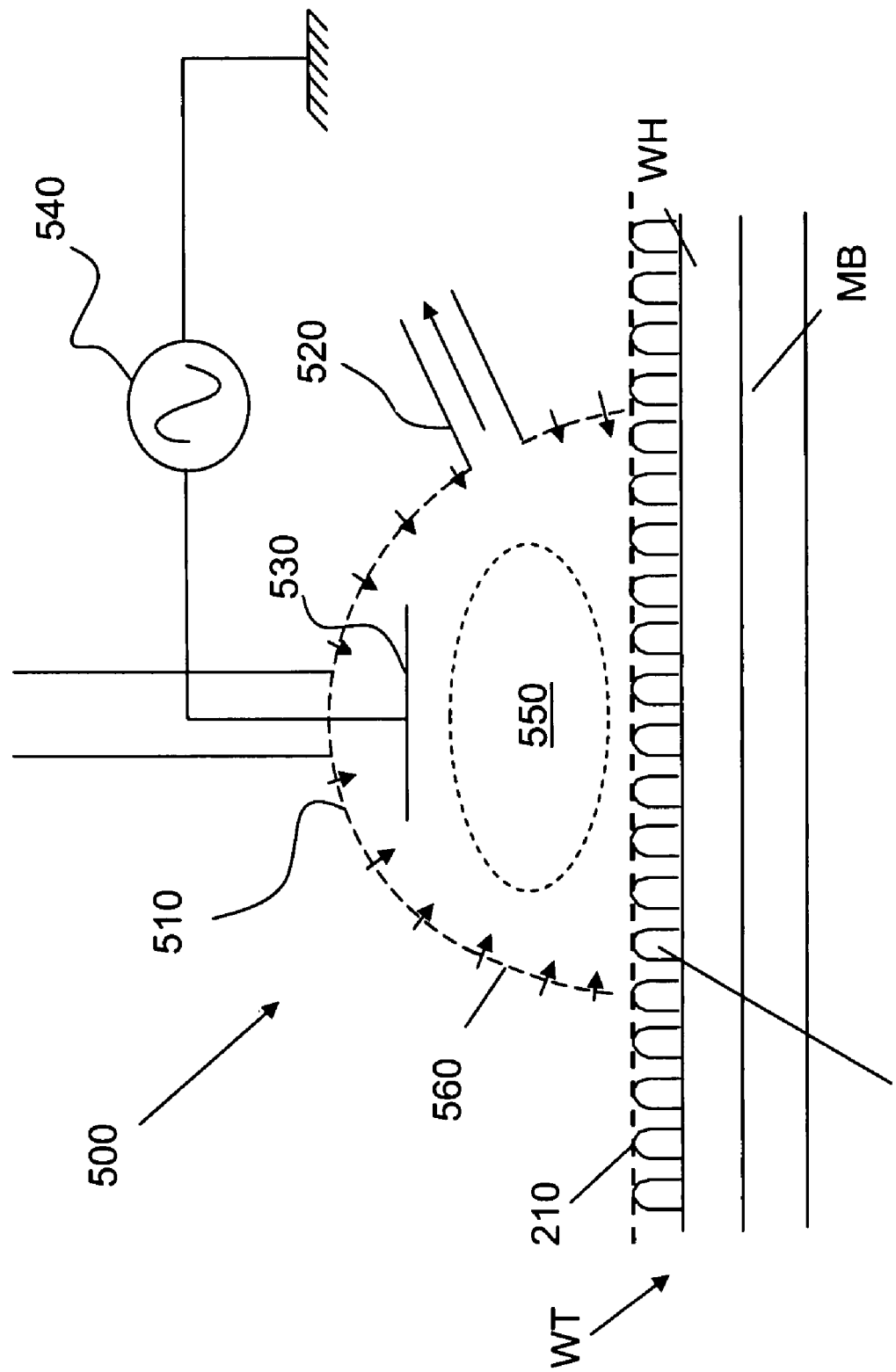
FIG. 5 schematically shows a cleaning unit in accordance with an embodiment of the invention.

Referring now to FIG. 5, this figure shows a cleaning unit 500 in accordance with an embodiment of the invention. The cleaning unit 500 is constructed and arranged to be used, for example, in an EUV system in which an atmosphere of molecular hydrogen is maintained around the housing or hood 510, e.g. in an area where the cleaning system 300 and the substrate table WT are located. Similarly to the embodiment of FIG. 4, the cleaning unit 500 includes a housing or hood 510 having an outlet 520 connected to a vacuum unit (not shown in FIG. 5). The cleaning unit 510 also includes an RF electrode 530 housed in the housing of hood 500 and connected to an RF power supply 540. 100511 The housing or hood 510 is formed with a mesh material including a plurality of openings 560 that are configured to allow gas communication between the outside and the inside of the housing 510. In this configuration, the atmosphere of hydrogen maintained within the space enclosed by the vacuum wall EN, i.e. outside the housing 510, is configured to act as a supply or source of hydrogen for the cleaning unit 500. Thus, in operation, the gas, e.g. molecular hydrogen $H_2$, present outside the housing 510 passes through the openings 560 and a plasma 550 is generated within the housing by the RF electrode 530. Gas communication through the housing 510 is schematically represented with arrows in FIG. 5. Hydrogen radicals, H., that are highly reactive are produced by the plasma 550 and react with the contaminants, e.g. organic contaminants, that may be present on the surface 210 of the substrate holder WH. These organic contaminants then desorb from the surface 210 and are subsequently extracted by the vacuum unit. It will be appreciated that removal of organic contaminants may also be achieved with the charged particles contained in the plasma. These charged particles are accelerated by the electric field between the electrode and the substrate holder WH so as to impinge on the surface 210. It will also be appreciated that additional gas, e.g. oxygen, may be used in another embodiment of the invention.

The pressure of the atmosphere of molecular hydrogen present in the space enclosed by the vacuum wall EN may be about 1 mBar (e.g., in a range between about 0.1 and 10 mbars). This pressure may be sufficient to provide enough neutral radicals to clean the surface 210. Alternatively, it is also possible to locally increase the pressure of the atmosphere of molecular hydrogen in the area where the cleaning unit 500 is located in order to facilitate plasma formation and increase the amount of radicals in the housing 510. For example, in an embodiment, the pressure of molecular hydrogen may be kept at a higher level in the metrology area 340 than in the exposure area 350.

It will be appreciated that the number and size of the openings 560 in the mesh material may vary. For example, in an embodiment, the size of the openings is in the range between about 0.1 and 10 mm. Alternatively, instead of using a mesh material, the housing 510 may be formed with an enclosure made of metal (e.g. stainless steel) having one or more openings to permit gas communication between the outside and the inside of the housing 510.

Figure 6:
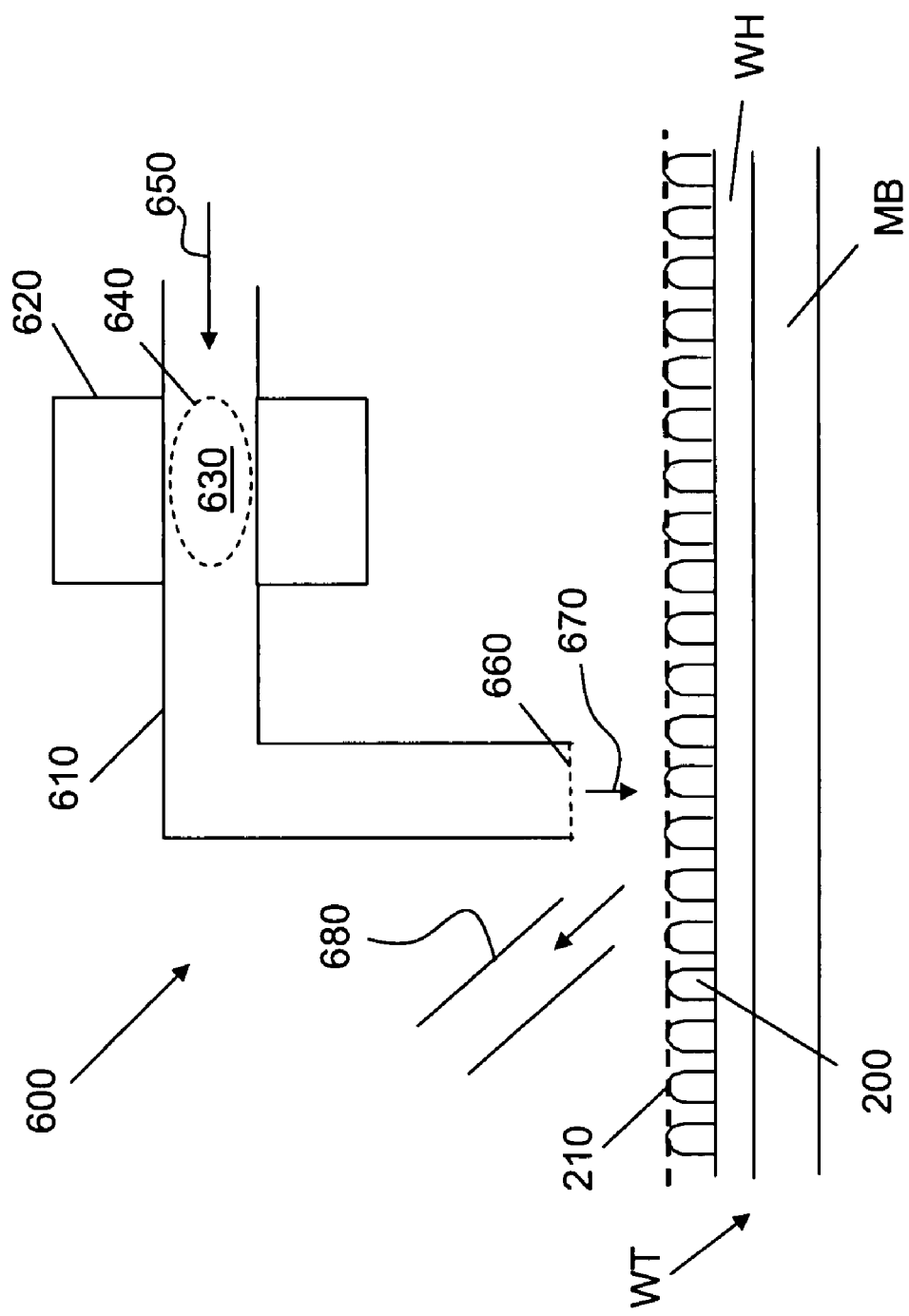
FIG. 6 schematically shows a cleaning unit in accordance with an embodiment of the invention.

FIG. 6 shows a cleaning unit 600 in accordance with an embodiment of the invention. The cleaning unit includes a tube 610 and a plasma generator 620. The plasma generator 620 is configured to create a plasma 630 in an area 640 of the tube 610. The plasma generator 620 may include, for example, an RF coil located along the tube 610 or a microwave or RF cavity. Other systems configured to generate the plasma 630 may also be used in other embodiments of the invention. Alternatively, the radicals may be created in a continuous or burst mode DC discharge. A flow 650 of molecular hydrogen or other gas, such as oxygen, is provided to flow through the tube 610. The hydrogen flows through the plasma 630, which creates a flow of neutral hydrogen radicals. In the plasma 630, neutral and ionized active particles are generated. The ionized particles may be neutralized by collisions with the walls of the tube 610 or with a Faraday grid 660 that may be located at, for example, the tube orifice. The neutral radicals exit the tube 610 as beam 670. The neutral radicals react with the organic contaminants that may be present on the surface 210 of the substrate holder 210. Contaminant particles desorbed by the neutral radicals may be evacuated by the outlet 680 of a vacuum unit (not shown in FIG. 6).

Figure 7:
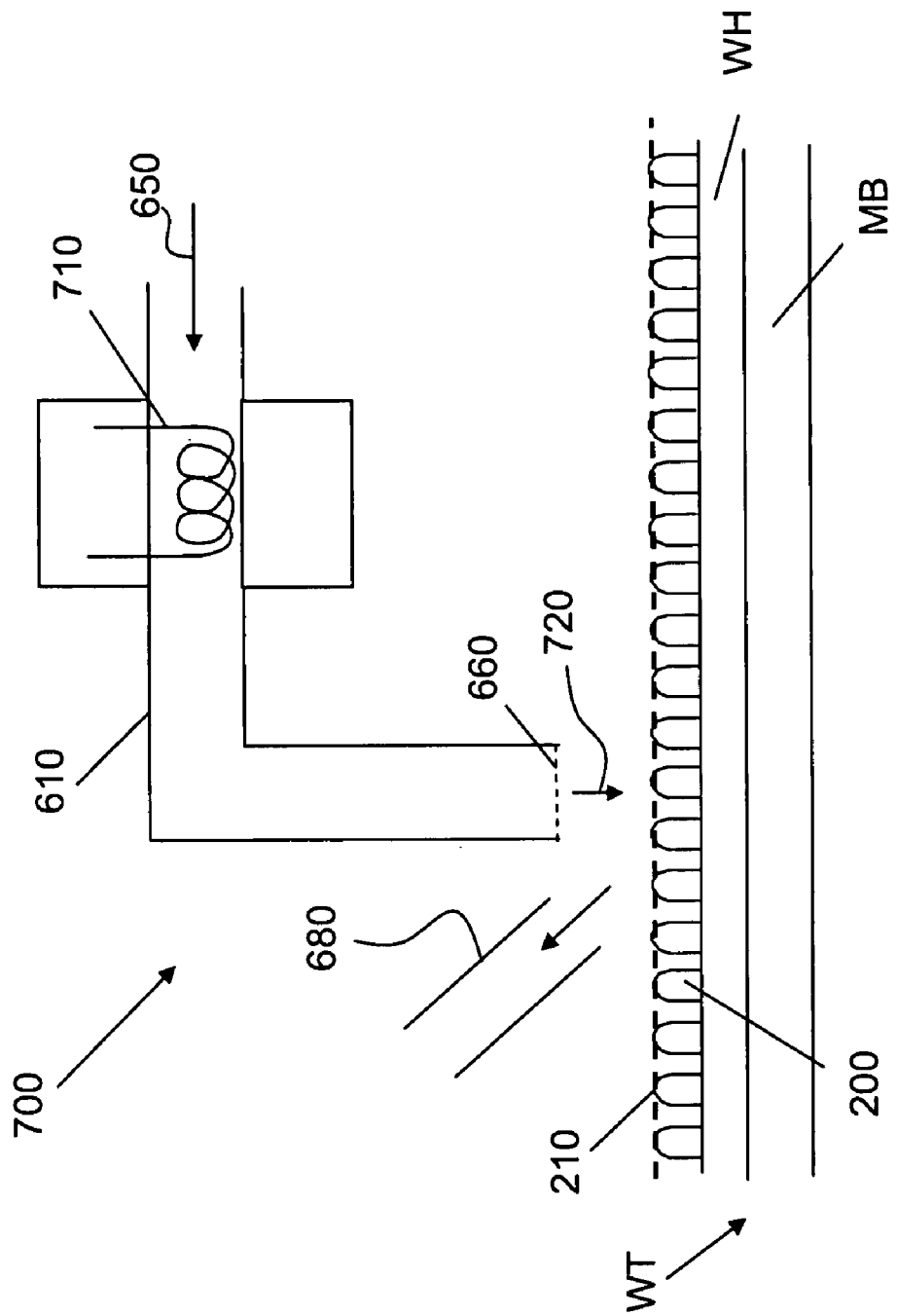
FIG. 7 schematically shows a cleaning unit in accordance with an embodiment of the invention.

FIG. 7 shows a variant of the apparatus shown in FIG. 6. In this case, the cleaning unit 700 is configured to generate radicals with a high temperature element 710 such as, e.g., a glowing wire. The heating element 710 may be at a temperature, for example, from about 1500° C. to about 1900° C., for efficient thermal dissociation. This apparatus and method is especially useful for generating a beam of hydrogen radicals 720 from a flow of hydrogen gas 650.

It will be appreciated that more than one outlet 680 may be provided in the cleaning units 600, 700 to evacuate the desorbed particles. Alternatively or in addition, an evacuation housing or hood may also be attached to the tube 610 in order to minimize the flow of gas into the remainder of the apparatus. A seal may be provided between the evacuation hood or housing and the surface 210 of the substrate holder WH.

In an embodiment, cleaning of the surface 210 of the substrate holder WH may combine cleaning with neutral radicals and abrasive cleaning to remove inorganic particles. Abrasive cleaning may be performed with a cleaning stone. The cleaning stone may be arranged in a separate cleaning block located in the metrology area 340. The cleaning stone may include a ceramic material, which may be electrically conductive. For example, the ceramic material may include alumina or titanium oxide and a metal as an additive. The cleaning stone may be electrically connected to ground potential to prevent the build up of an electrostatic charge during the cleaning operation. Such a build up of electrostatic charge may cause an electrostatic attraction between the surface 210 and the cleaning stone.

Referring back to FIG. 3, the cleaning system 300 may also include a contamination detection unit 360 to detect contamination particles on the surface of the substrate holder WH. The contamination detection unit 360 and the substrate table WT may be moved relative to each other such that the entire surface 210 of the substrate holder WH may be scanned to detect potential contamination particles. The cleaning unit 310 and the contamination detection unit 360 may be operatively controlled by a controller 370. Based on the contamination measurements provided by the contamination detection unit 360, the controller 370 may command the cleaning unit 310 to clean specific areas or locations on the surface 210 of the substrate holder WH. For example, the controller may command the substrate table WT, the cleaning unit 310 or both to move relative to each other so that the cleaning unit 310 is positioned proximate the area where a contamination particle has been detected. In that way, it is possible to substantially reduce the cleaning time. Alternatively, it is also possible to clean the entire surface of the substrate holder WH.

The contamination detection unit 360 may be provided with a level sensor including a source of radiation, a lens system and a detector (not shown in FIG. 3). The level sensor may be used to detect a surface figure of the surface of a substrate W held with its backside on the support surface 210 of the substrate holder WH. When the level sensor is used, the source of radiation produces a beam of radiation which is directed onto the surface of the substrate W. The beam of radiation is then reflected at the surface of the substrate W and subsequently directed to the detector. The detector is constructed and arranged to measure a change in the direction of the beam, indicating a deformation of the surface figure of the top surface of the substrate W. Such a deformation may be caused by the substrate W being thicker at a particular location or by contaminants present between the backside surface of the substrate W and the support surface 210. By storing the surface figures of at least two substrates in a data storage unit and by comparing those surface figures, a recurring deformation in the surface figures at a similar location may be detected. This may indicate a contamination of the support surface 210 at this location. The level sensor may be a focus detection system.

Although the above description has only specified a single downstream radical source within an apparatus, it will be appreciated that the total cleaning time needed may be reduced by providing two or more downstream radical sources within the apparatus 1.

Software functionalities of a computer system involving programming, including executable codes, may be used to implement the above cleaning process. The software code may be executable by a general-purpose computer. In operation, the code and possibly the associated data records may be stored within a general-purpose computer platform. At other times, however, the software may be stored at other locations and/or transported for loading into an appropriate general-purpose computer system. Hence, the embodiments discussed above involve one or more software or computer products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as the main memory of a computer system. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

While specific embodiments of the invention have been described above, it will be appreciated that the invention may be practiced other than as described. The description is not intended to limit the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The lithographic apparatus may also be of a type wherein a surface of the substrate is immersed in a liquid having a relatively high refractive index, e.g., water, so as to fill a space between a final element of the projection system and the substrate. Immersion liquids may also be applied to other spaces in the lithographic apparatus, for example between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A lithographic apparatus comprising:
    an illumination system configured to condition a beam of radiation;
    a pattern support configured to hold a patterning device, the patterning device configured to pattern the beam of radiation to form a patterned beam of radiation;
    a substrate holder configured to hold a substrate, the substrate holder including a support surface in contact with the substrate;
    a projection system configured to project the patterned beam of radiation onto the substrate; and
    a cleaning system including a cleaning unit, the cleaning unit constructed and arranged to generate radicals, ions or both on the support surface of the substrate holder to remove contamination therefrom, wherein the cleaning system is located in an area of the apparatus in which an atmosphere of hydrogen is maintained, and wherein the cleaning unit includes
        a housing including a plurality of openings and an outlet in communication with a vacuum unit, the plurality of openings enabling gas communication between the atmosphere of hydrogen and an interior of the housing, and
        a plasma generator arranged in the interior of the housing and configured to create a plasma of hydrogen to generate hydrogen radicals, the atmosphere of hydrogen configured to act as a supply of hydrogen for the plasma generator.

2. The apparatus of claim 1, wherein the beam of radiation has a wavelength in the extreme ultraviolet range.

3. The apparatus of claim 1, wherein the plasma generator includes a RF electrode, a DC discharge electrode or a RF coil.

4. The apparatus of claim 1, wherein the housing, in use, is positioned proximate the substrate holder to generate the radicals on at least a portion of the support surface.

5. The apparatus of claim 4, wherein the housing is constructed and arranged to substantially cover an entire area defined by the support surface.

6. The apparatus of claim 1, wherein, in use, the substrate holder and the cleaning unit are movable relative to each other.

7. The apparatus of claim 6, wherein the cleaning unit is movable along a direction substantially perpendicular to the support surface.

8. The apparatus of claim 1, wherein the cleaning system further comprises a contamination detection system configured to detect contamination on the support surface and a controller in communication with the contamination detection system and the cleaning unit, the controller configured to control a position of the cleaning unit, the substrate holder, or both, based on a result of detection of the contamination detection system.

9. The apparatus of claim 1, wherein the housing is made of a mesh material.

10. The apparatus of claim 1, wherein the cleaning unit includes a high temperature element located within a flow of hydrogen, the temperature of the high temperature element being sufficient to cause thermal dissociation to create the radicals.

11. The apparatus of claim 1, wherein the radicals include oxygen radicals.

12. The apparatus of claim 1, wherein the housing is formed with an enclosure made of metal.

13. A device manufacturing method comprising:
conditioning a beam of radiation;
patterning the beam of radiation to form a patterned beam of radiation;
projecting the patterned beam of radiation onto a substrate, the substrate supported by a support surface of a substrate holder; and
generating radicals, ions or both on the support surface of the substrate holder to remove contamination therefrom, said generating includes
supplying hydrogen to an interior of a housing by maintaining an atmosphere of hydrogen in an area where the substrate holder is located, and
producing a plasma of hydrogen within the housing to generate hydrogen radicals.

14. The method of claim 13, wherein the beam of radiation has a wavelength in the extreme ultraviolet range.

15. The method of claim 13, wherein the housing is made of a mesh material.

16. The method of claim 13, wherein the plasma is produced with a RF electrode, a DC discharge electrode or a RF coil.

17. The method Of claim 13, further comprising moving the housing, the substrate holder, or both, to position the housing proximate the substrate holder so as to generate the radicals on at least a portion of the support surface.

18. The method of claim 17, wherein the housing is constructed and arranged to substantially cover an entire area defined by the support surface.

19. The method of claim 13, further comprising detecting contamination of the support surface and, based on the detecting, controlling a position of the cleaning unit, the substrate holder, or both , to position the housing proximate the substrate holder so as to generate the radicals on at least a portion of the support surface.

20. The method of claim 13, wherein the radicals include oxygen radicals.

21. The method of claim 13, wherein the housing is formed with an enclosure made of metal.

* * * * *